United States Patent
Chung

(10) Patent No.: US 6,713,332 B2
(45) Date of Patent: Mar. 30, 2004

(54) NON-VOLATILE MEMORY DEVICE WITH ENLARGED TRAPPING LAYER

(75) Inventor: Chia-Chi Chung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/145,203

(22) Filed: May 13, 2002

(65) Prior Publication Data

US 2003/0211690 A1 Nov. 13, 2003

(51) Int. Cl.[7] ................ H01L 21/336; H01L 21/8234
(52) U.S. Cl. .......................... 438/197; 438/954
(58) Field of Search .................. 438/197, 257, 438/259, 262, 266, 270, 484, 636, 692, 695, 697, 699, 680, 681, 954

(56) References Cited

U.S. PATENT DOCUMENTS

| | | | | |
|---|---|---|---|---|
| 6,429,063 B1 | * | 8/2002 | Eitan | 438/232 |
| 6,432,788 B1 | * | 8/2002 | Maruska et al. | 438/276 |
| 6,440,798 B1 | * | 8/2002 | Lai et al. | 438/266 |

* cited by examiner

Primary Examiner—David Nhu
(74) Attorney, Agent, or Firm—Stout, Uxa, Buyan & Mullins, LLP

(57) ABSTRACT

Methods for making a nonvolatile memory device, such as an NROM device that has an oxide-nitride-oxide layer beneath at least one word line structure, are disclosed. The oxide-nitride-oxide layer is in the form of a plurality of oxide-nitride block structures disposed over an oxide layer, with each of the oxide-nitride block structures overlapping two adjoining bit lines. A dielectric resolution enhancement coating technique is performed to precisely control the oxide-nitride block structure dimensions.

21 Claims, 8 Drawing Sheets

NON-VOLATILE MEMORY DEVICE WITH ENLARGED TRAPPING LAYER

BACKGROUND OF THE INVENTION

1. Field of the Invention

The present invention relates to non-volatile memory devices and, more particularly, to non-volatile memory devices having two bits per cell.

2. Description of Related Art

A non-volatile semiconductor memory device is designed to maintain programmed information even in the absence of provided power. The read-only memory (ROM) is a non-volatile memory device commonly used in electronic equipment such as microprocessor-based digital electronic equipment and portable electronic devices such as cellular phones.

ROM devices are conventionally arranged into a plurality of memory cell arrays. Each memory cell includes a transistor, which typically comprises a metal-oxide-semiconductor field effect transistor (MOSFETs) that is juxtaposed between two intersecting bit lines and a word line. Data bit values or codes held by these memory cell transistors are permanently stored (until deliberate erasure) in the physical or electrical properties of the individual memory cells. Generally speaking, a consequence of the non-volatile nature of a ROM is that data stored in the memory device can only be read.

A relatively recent development in non volatile memory has been the advent of Nitride-Read Only Memory (NROM) devices. NROM devices offer a number of advantages over the 30 year old currently dominant floating gate devices such as EPROM, Flash, and EEPROM, which store charge in a conductive floating gate.

NROM cells can comprise 2 bit flash cells based on charge storage in an Oxide-Nitride-Oxide (ONO) dielectric. The NROM cell may comprise an n-channel MOSFET device wherein nitride is used as a trapping material between a top and bottom oxide. The ONO structure replaces the gate dielectric that is used in floating gate devices. The top and bottom oxide layers should be thicker than 50 A to prevent any oxide damaging direct electron tunneling during programming.

NROM flash blocks may be added to standard CMOS processes by laying down the ONO layer after the field isolation but before the gate oxidation. Adding the NROM components typically has minimal effects on the CMOS thermal budgets. The NROM memory cells can be programmed by channel hot electron (CHE) injection, and erased by tunneling enhanced hot hole (TEHH) injection through the bottom oxide. The NROM cells operate as localized charge storage devices, which allows the trapped charge to remain only at the injection point. Thus, single bit failures commonly experienced by floating gate technologies may be reduced. This reduction may allow for further minimization of device size and increased device density without degradation in performance.

NROM devices can offer a number of significant advantages over floating gate devices. Both the bit size and the die size can be a factor of 3 or more smaller for NROM devices. NROM devices can also require 6 to 8 fewer photomask steps, their process complexity can be simpler, and it can be easier to integrate them with CMOS devices for embedded applications. Furthermore, NROM devices can be more suited to low voltage product implementation due to a lower erased threshold voltage. However, a common problem with NROM devices can be the lateral leakage of trapped charge over the ONO layer edge. Another problem that may occur with manufacturing memory devices having critical dimensions (CD) below around 0.15 µm, is a failure to properly resolve the device geometries when undergoing photolithographic processing.

SUMMARY OF THE INVENTION

The present invention relates to nonvolatile memory devices and methods of forming such nonvolatile memory devices. More particularly the invention herein provides improved methods of manufacturing NROM memory devices. The improved processing methods may reduce the occurrence of electron leakage from the trapped charge in the nitride layer during high stress operation conditions such as high voltage and/or high temperature. Such leakage may occur at the ONO layer edge. However, forming an ONO stack that has a larger area than the gate structure (i.e., the portion of a word line between two bit lines) and which overlaps the adjoining bit lines in accordance with the present invention, can attenuate or eliminate this problem. The invention also provides a dielectric resolution enhancement coating technique to overcome photolithography limitations of patterning the ONO stack below dimensions around 0.15 µm. Using a dielectric resolution enhancement coating technique in accordance with the present invention can allow for device dimensions which are smaller than the wavelength of the UV radiation used to pattern the photo-resist and create the devices.

In accordance with an aspect of the present invention, a method for forming at least one nonvolatile memory device can comprise the steps of: (a) forming a trapping layer on a prepared semiconductor substrate; (b) forming a patterned photoresist layer on the trapping layer; (c) using the photoresist layer as an implanting mask to perform an implantation to form at least one bit line; (d) forming a first polymer layer on surfaces of the photoresist layer; (e) using the first polymer layer as an etching mask to pattern the trapping layer into at least one trapping layer strip; (f) removing the first polymer and the photoresist layer; (g) forming an oxide beside the at least one trapping layer strip and above the at least one bit line; (h) forming at least one word line on the at least one trapping layer strip; (h) forming a second polymer layer on surfaces of the at least one word line; (i) using the second polymer layer as an etching mask to pattern the at least one trapping layer strip into a plurality of trapping layer blocks; and (j) removing the second polymer.

The trapping layer may comprise in sequence a first oxide layer, a nitride layer, and a second oxide layer, wherein the first oxide layer, nitride layer, and second oxide layer form an ONO stack. The ONO stack may be patterned such that the first oxide layer remains substantially unpatterned. A BARC may be deposited prior to the application of the photoresist layer. The at least one bit line may comprise a plurality of bit lines, the at least one trapping layer strip may comprise a plurality of trapping layer strips, and the at least one word line may comprise a plurality of word lines.

In accordance with another aspect of the present invention, a method for forming a nonvolatile memory on a semiconductor substrate can comprise the steps of (a) providing a prepared semiconductor substrate; (b) forming a trapping layer on the semiconductor substrate; (c) applying and patterning a photoresist over the trapping layer to form a plurality of photoresist strips; (d) selectively implanting the semiconductor substrate to form a plurality of bit lines; (e) forming a first polymer on the surfaces of the patterned photoresist; (f) forming a plurality of trapping layer strips by etching back portions of the trapping layer; (g) removing the first polymer and the patterned photoresist; (h) forming an oxide over the plurality of bit lines; (i) forming a plurality of word lines; (j) forming a second polymer over the word lines; (k) etching portions of the plurality of trapping layer strips to form a plurality of trapping layer block structures; and (l) removing the second polymer.

The trapping layer may comprise in sequence a first oxide layer, a nitride layer, and a second oxide layer, the first oxide layer, nitride layer, and second oxide layer forming an ONO stack. The second oxide layer formed in the foregoing method may consume some portion of the nitride layer during its growth. The etch performed in step (f) may remove portions of the second oxide layer and the nitride layer, and may remove a relatively small portion of the first oxide layer. The first polymer and second polymer can be formed using a dielectric resolution enhancement coating technique, which may be performed in an etcher. The first polymer and second polymer may be used as etch masks to protect the underlying layers during etch processing. The word lines are preferably centrally disposed over corresponding members of the plurality of trapping layer block structures, the plurality of trapping layer block structures overlap portions of adjoining members of the plurality of bit lines, and the trapping layer block structures have greater widths than the corresponding word lines.

In accordance with one aspect of the present invention, a nonvolatile memory device comprises a prepared semiconductor substrate in which a plurality of bit lines are implanted. A plurality of trapping layer block structures form rows and columns, and a plurality of word lines are positioned over corresponding members of the plurality of trapping layer block structures. A dielectric is disposed between the plurality of word lines and trapping layer block structures.

According to another aspect of the invention, a plurality of trapping layer block structures can overlap portions of adjoining members of the plurality of bit lines, and may be wider than members of the plurality of word lines. The word lines may be centrally disposed above corresponding members of the plurality of trapping layer block structures.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

FIG. 6b is a perspective view showing an NROM device at the same processing stage as shown in FIG. 6a;

DETAILED DESCRIPTION OF PRESENTLY PREFERRED EMBODIMENTS

Figure 1:
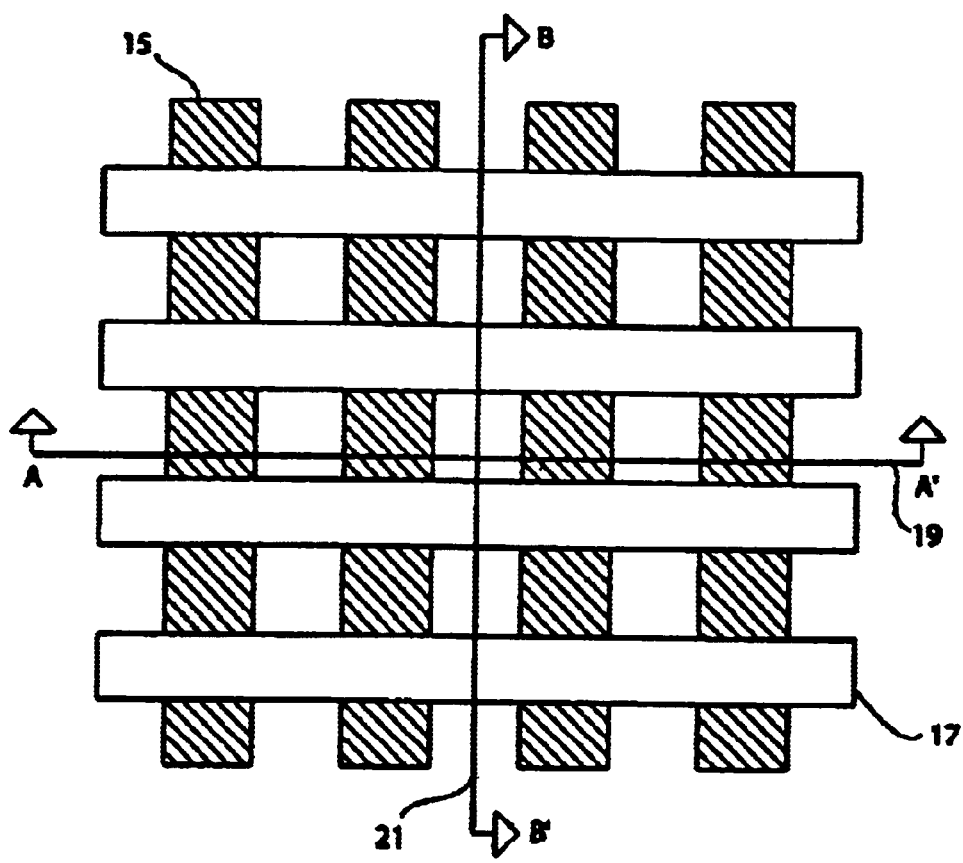
FIG. 1 is a plan view of an NROM semiconductor device after the formation of word lines and bit lines.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that NROM device technology can be used to replace the floating gate technologies of nonvolatile memory devices such as EPROM, Flash, and EEPROM with their NROM counterparts.

It is to be understood and appreciated that the process steps and structures described herein do not cover a complete process flow for the manufacture of NROM memory devices. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 illustrates a plan view of a plurality of bit lines 15 orthogonally disposed relative to a plurality of word lines 17. The plurality of bit lines 15 and plurality of word lines 17 may be fabricated on a semiconductor substrate (e.g., doped silicon) alongside customary complementary metal oxide semiconductor (CMOS) devices on the same chip or die. Standard initial CMOS processes are used to prepare the substrate for the application of NROM cells, including for example, field oxidation and well implant steps.

A portion of line A–A' 19, extending orthogonally to the plurality of bit lines 15 over a region not defined by one of the plurality of word lines 17, corresponds to the zoomed in cross-sectional views of FIGS. 2 through 6. Likewise, a portion of line B–B' 21, extending orthogonally relative to the plurality of word lines 17 over a region not defined by one of the plurality of bit lines 15, corresponds to the zoomed in cross-sectional views of FIGS. 8 through 10 and FIG. 12.

Figure 2:
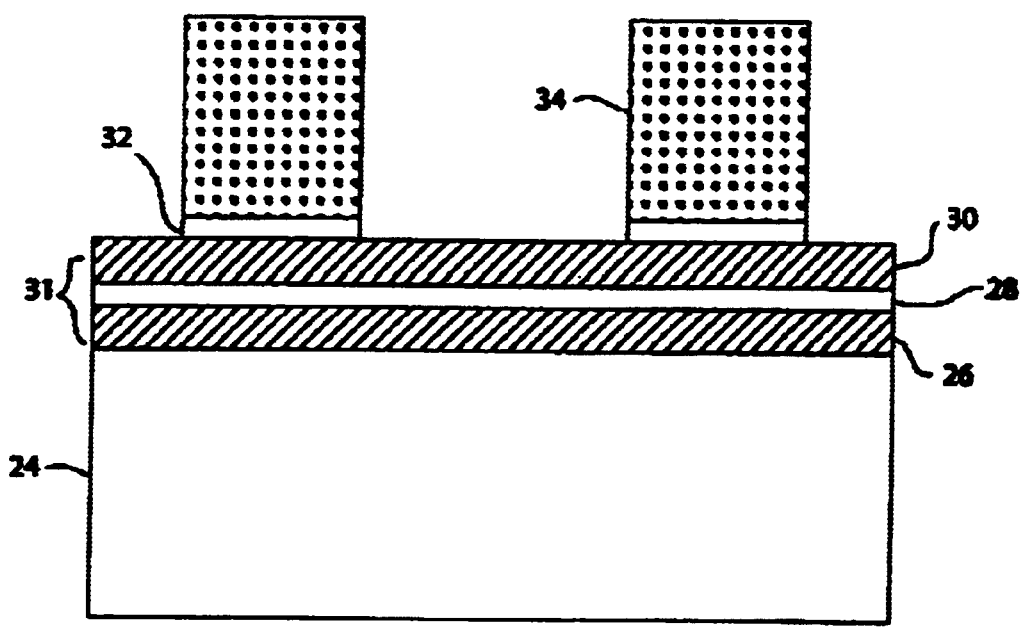
FIG. 2 is a cross-sectional view of an NROM semiconductor device in an intermediate processing step.
Figure 3:
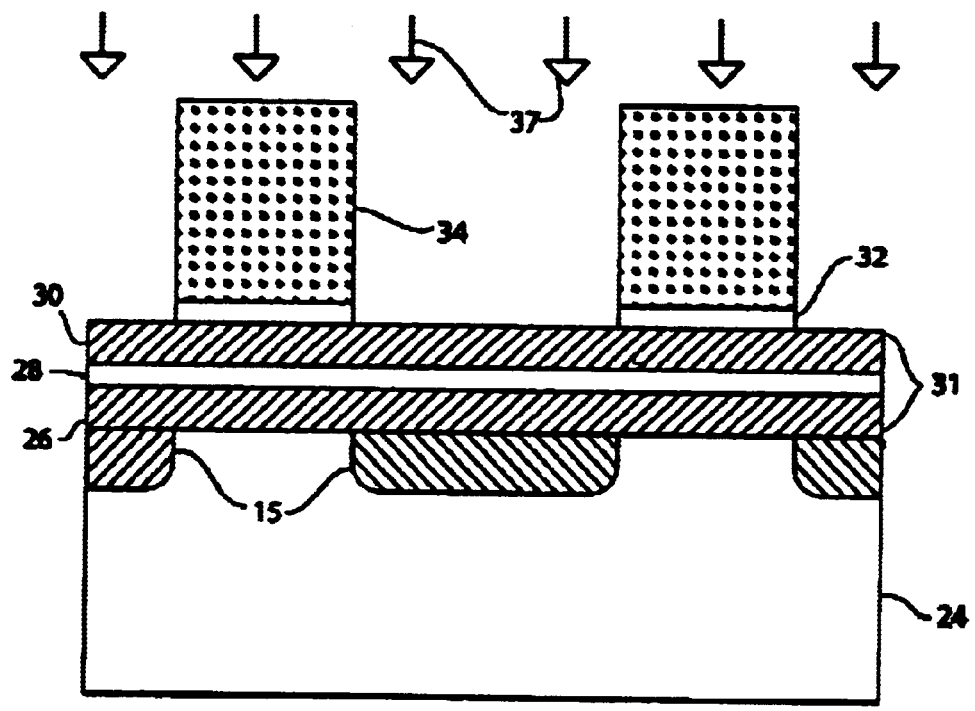
FIG. 3 is the cross-sectional view of FIG. 2 after a subsequent implant step.

Referring now to FIG. 2, a trapping layer, which preferably comprises a first oxide layer 26, a nitride layer 28, and a second oxide layer 30 has been deposited and/or grown over a prepared substrate 24. The first oxide layer 26 and the second oxide layer 30 should be thick enough to prevent the occurrence of electron tunneling between trapped electrons in the nitride layer 28 and one of the plurality of bit lines 15 or plurality of word lines 17, which may occur at thicknesses below around 50 angstroms (A). Preferably, the first oxide layer 26 is grown or deposited to a thickness of about 50 to 100 A, the nitride layer 28 is deposited to a thickness of between about 35 and 75 A, and the second oxide layer 30 is grown or deposited to a thickness of about 50 to 150 A.

If the second oxide layer 30 is grown over the nitride layer 28 rather than deposited, then some portion of the nitride layer 28 is consumed in the formation of the oxide at approximately the rate of 1 A of nitride consumed to 2 A of oxide formed. Thus, the nitride layer 28 must be deposited to the desired thickness of 35 to 75 A plus half the desired thickness of the second oxide layer 30. For example, if it is desired for the second oxide layer 30 to have a thickness of 150 A, and for the nitride layer 28 to have a thickness of 50 A, then the nitride layer 28 must initially be deposited to a thickness of 125 A (50 A+75 A).

The first oxide layer 26, nitride layer 28, and second oxide layer 30 define an oxide-nitride-oxide (ONO) stack 31. The ONO stack 31 acts to trap charge within the nitride layer 28, which is electrically isolated by the second oxide layer 30 and the first oxide layer 26.

A bottom anti reflective coating (BARC) 32 is deposited followed by the application of a photoresist layer 34, which may be either positive or negative photoresist. The photoresist layer 34 is patterned and developed using common photolithographic processes, forming a pattern of photoresist bars extending perpendicularly into the page, as shown in FIG. 2. As in FIG. 3, a dopant 37 such as arsenic or phosphorous is introduced into the exposed portions of the prepared substrate 24 by ion implantation to form source and drain regions, or a plurality bit lines 15. The implantation occurs through the ONO stack 31, which may prevent the occurrence of ion channeling by providing a surface to implant through that does not follow the lattice structure of the underlying substrate.

Figure 4:
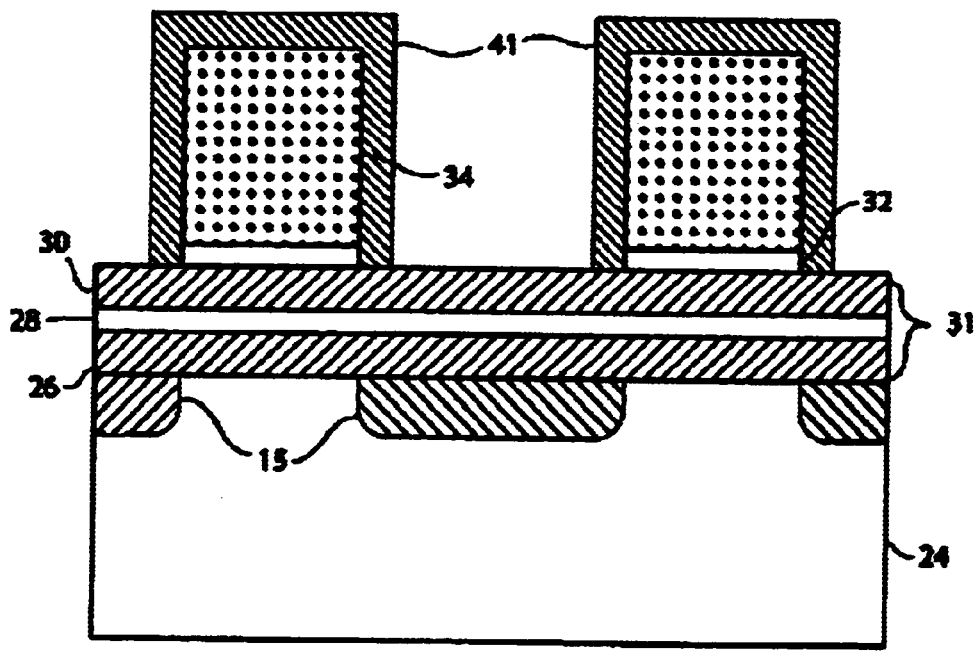
FIG. 4 is the cross-sectional view of FIG. 3 with the addition of a polymer.
Figure 5:
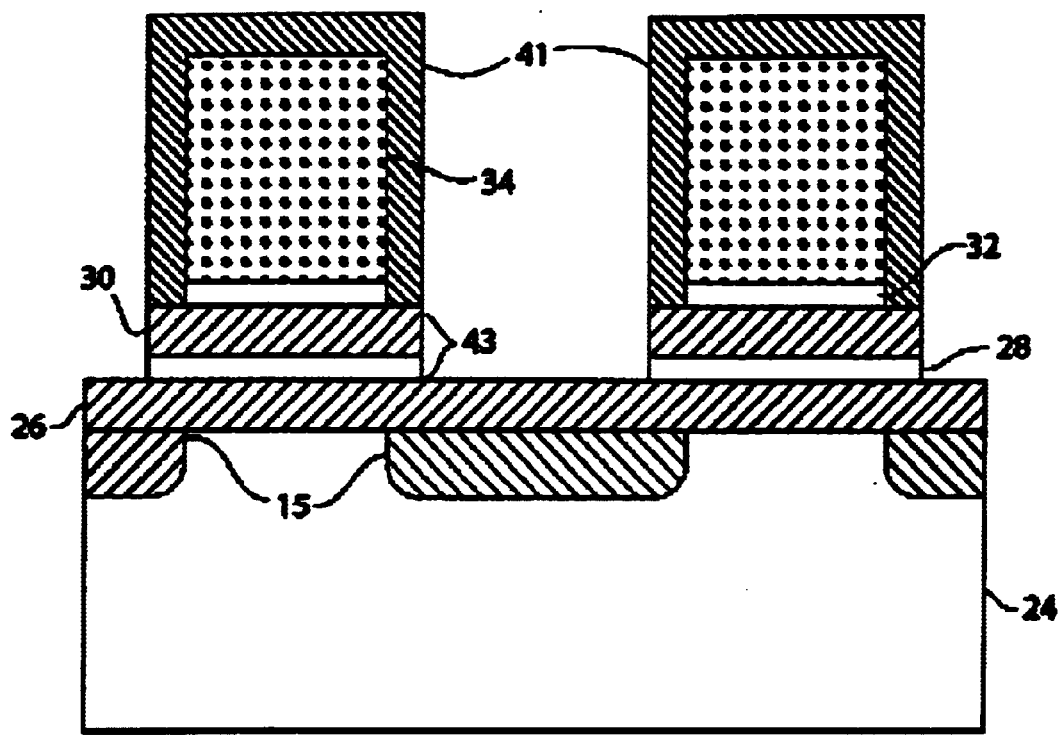
FIG. 5 is the cross-sectional view of FIG. 4 after a subsequent etch process step.

Proceeding to FIG. 4, a first polymer 41 is formed on the surfaces of the photoresist layer 34 with a dielectric resolution enhancement coating technique that is performed for example in an etcher, such that the first polymer 41 extends over portions of one or more of a plurality of bit lines 15. In the illustrated embodiment, the first polymer 41 is deposited using a low-temperature (i.e., below about 110 degrees C.) plasma-enhanced chemical vapor deposition (PECVD) method at a pressure of about 1 mT to about 100 mT; a source power of about 500 W to about 2000 W; a bias power of about 0 W to about 1100 W; and using a $C_4F_8/CH_2F_2/CHF_3/C_4F_6/C_5F_8/CO/Ar$ mixture. The first polymer 41 then performs the function of an etching mask, preventing the underlying layers from being removed during the subsequent etch back of the second oxide layer 30 and nitride layer 28. As illustrated in FIG. 5, exposed regions of the second oxide layer 30 and nitride layer 28 are completely removed by the etch process, leaving an exposed first oxide layer 26.

Figure 6A:
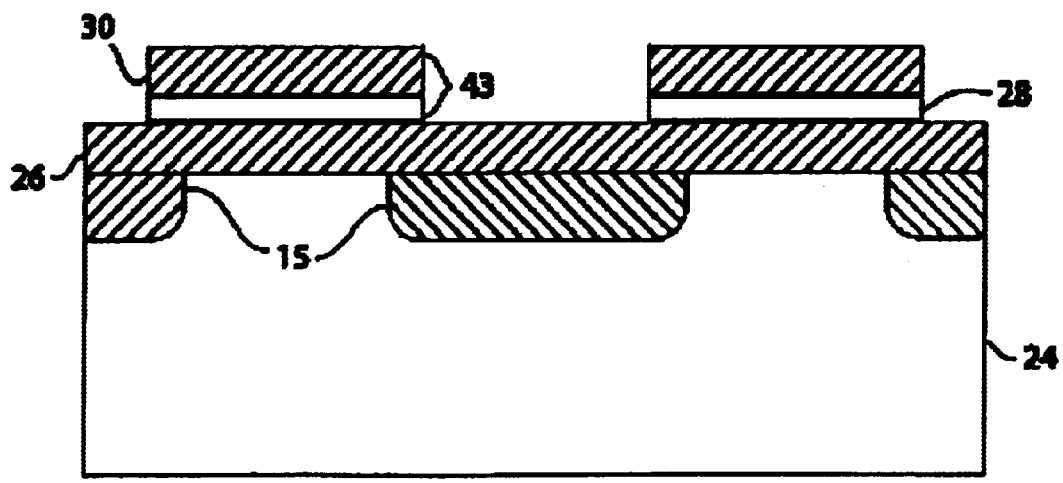
FIG. 6a is the cross-sectional view of FIG. 5 after all photoresist has been removed.
Figure 6B:
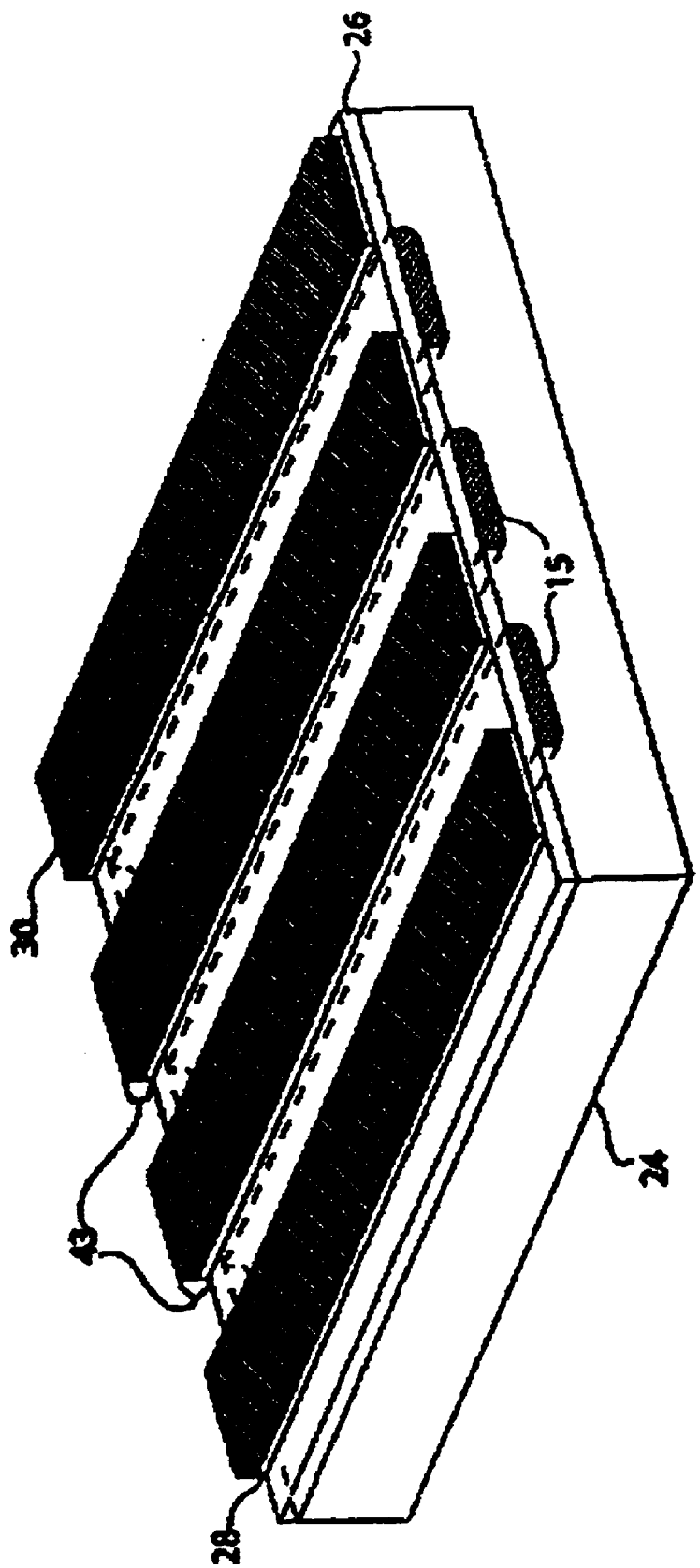
Figure 7:
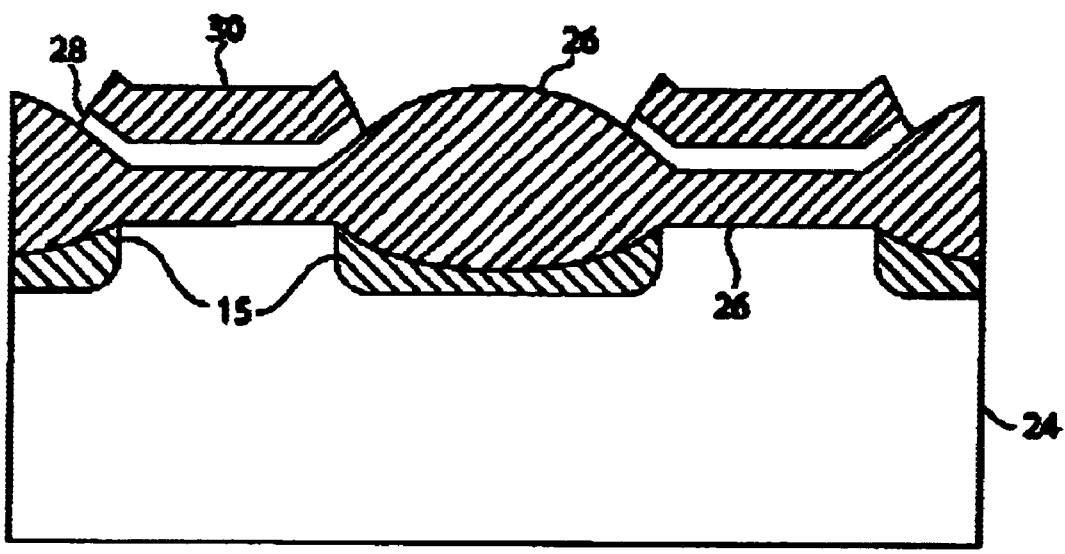
FIG. 7 is a cross-sectional view of an NROM device after growing of an oxide.

In the configuration of FIG. 6a, the first polymer 41, photoresist layer 34, and BARC 32 have been removed by standard strip and ash procedures. Thus, the ONO stack is patterned to form a plurality of oxide-nitride (ON) strips 43 over the first oxide layer 26, wherein each of the plurality of ON strips 43 lies between two adjacent bit lines, and wherein each of the openings is self-aligned with one of the plurality of bit lines 15. FIG. 6b illustrates a perspective view of the wafer shown in FIG. 6a. As evidenced by the drawing, a plurality of ON strips 43 lies in a staggered formation relative to a plurality of bit lines 15 (shown in phantom), such that an overlap occurs between adjacent members of the plurality of bit lines 15 and the plurality of ON strips 43. In FIG. 7, a thermal oxidation process is implemented to grow exposed surfaces of the first oxide layer 26 in the bit line direction. As presently embodied, the first oxide layer 26 is grown between the trapping layer strips until a height of the first oxide layer 26 is about equal to a height of the second oxide layer 30.

Figure 8:
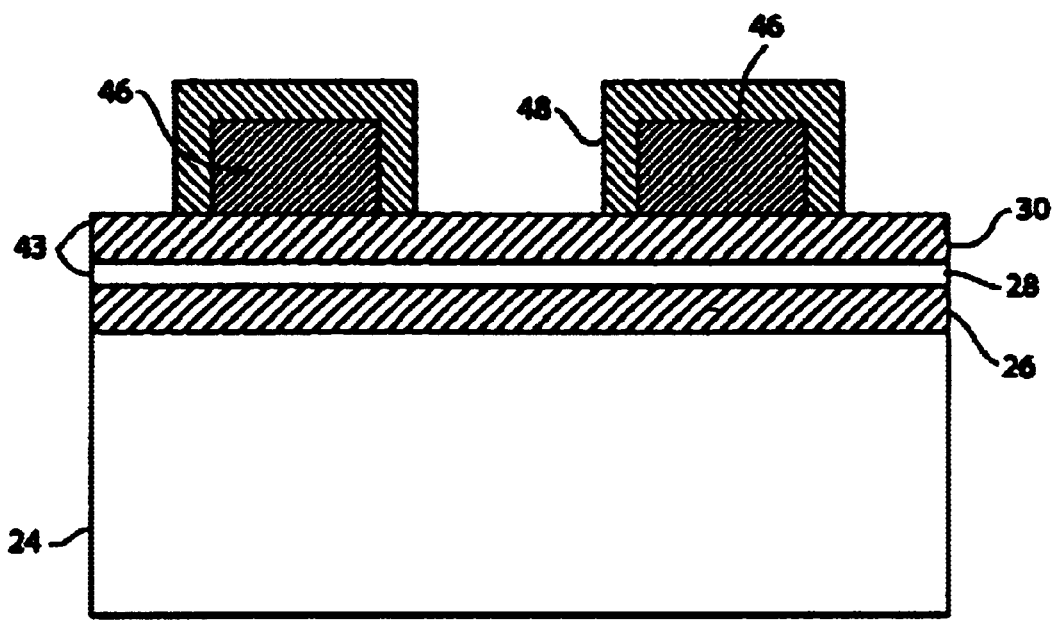
FIG. 8 is a cross-sectional view of an NROM device cut orthogonally to FIGS. 2 through 6 in an intermediate processing step.

In the cross-sectional view of the NROM device of FIG. 8, which is taken along the line B–B' 21 of FIG. 1, a layer of polysilicon has been deposited over the existing structures and formed into a plurality of word lines 46. Regarding this formation, a photoresist is applied, patterned, and developed using standard photolithographic techniques, to form a plurality of elongate photoresist structures. The elongate photoresist structures are used to facilitate the etching of the layer of polysilicion to form a plurality of elongate gate or word line structures 46. The word line structures 46 are disposed above corresponding members of the plurality of ON strips 43. Subsequently, a second polymer 48 is formed only on the surfaces of the plurality of word line structures 46, using the above-described dielectric resolution enhancement coating technique.

Figure 9:
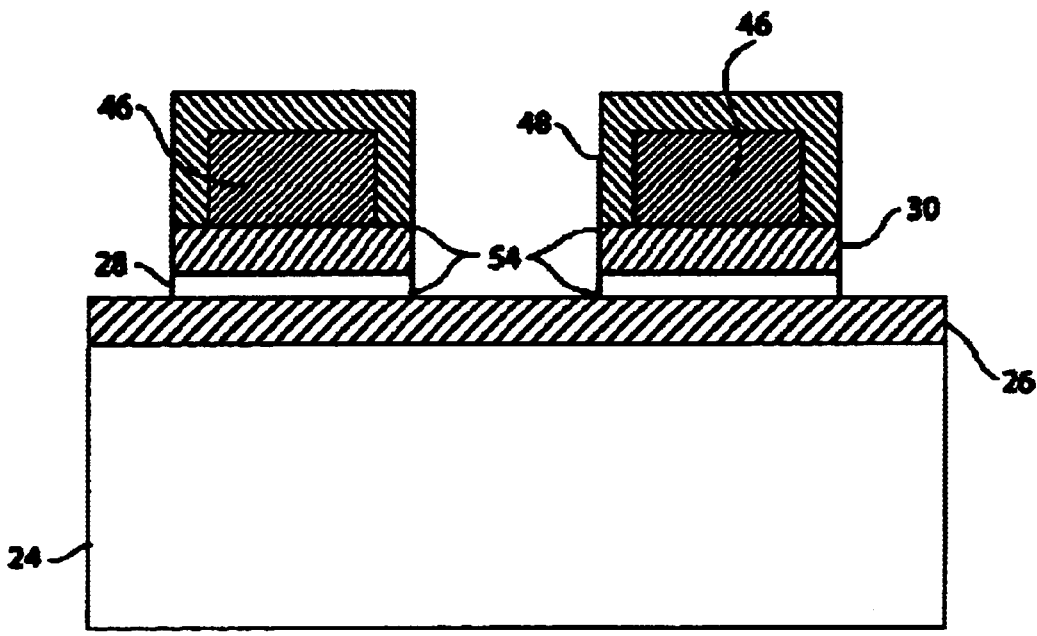
FIG. 9 is a cross-sectional view of the NROM device in FIG. 8 after a subsequent etch process step.
Figure 10:
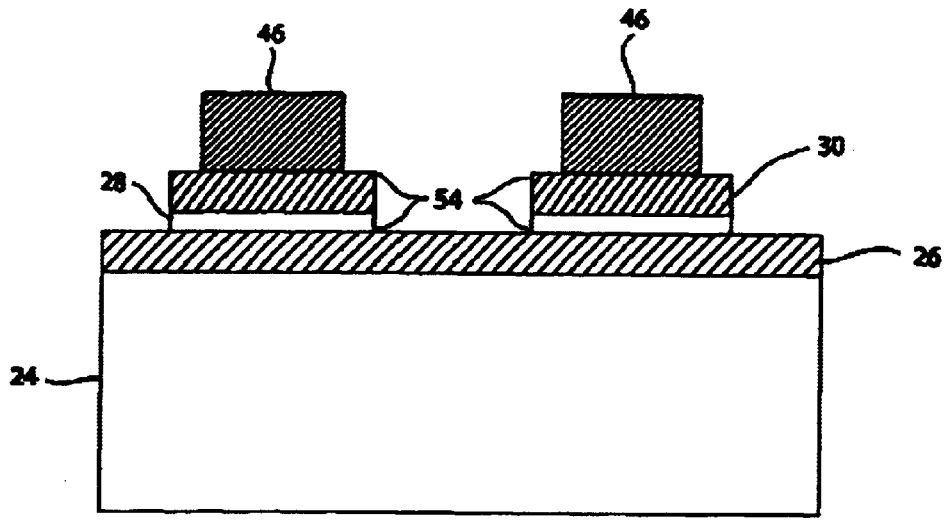
FIG. 10 is a cross-sectional view of the NROM device in FIG. 9 after the removal of a polymer layer.

Referring now to FIG. 9, the second polymer 48 functions as an etching mask for patterning the plurality of ON strips 43 into a plurality of ON block structures 54. Each of the plurality of word line structures 46 is preferably centrally disposed above, and has a width smaller than, a corresponding member of the plurality of ON block structures 54. Thereafter, the second polymer 48 is removed by a dry or wet etch procedure, the resultant structures of which are illustrated in FIG. 10.

Other methods for forming an ON block structure that has a larger area than the gate structure (i.e., the part of a word line between two bit lines) are also possible. For example, it may be possible to include an additional step of adding a photoresist and patterning it so that it exhibits the proper dimensions in place of both the first polymer and second polymer steps. The ON layer would then be etched to the desired dimensions according to the dimensions of the above lying photoresist layers.

Figure 11:
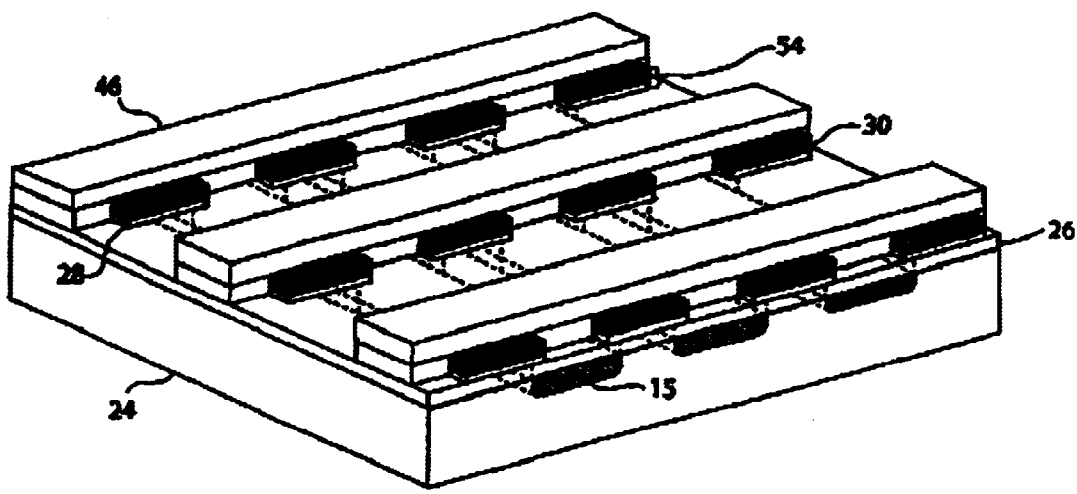
FIG. 11 is a perspective view of an NROM device at the same processing step as FIG. 10.
Figure 12:
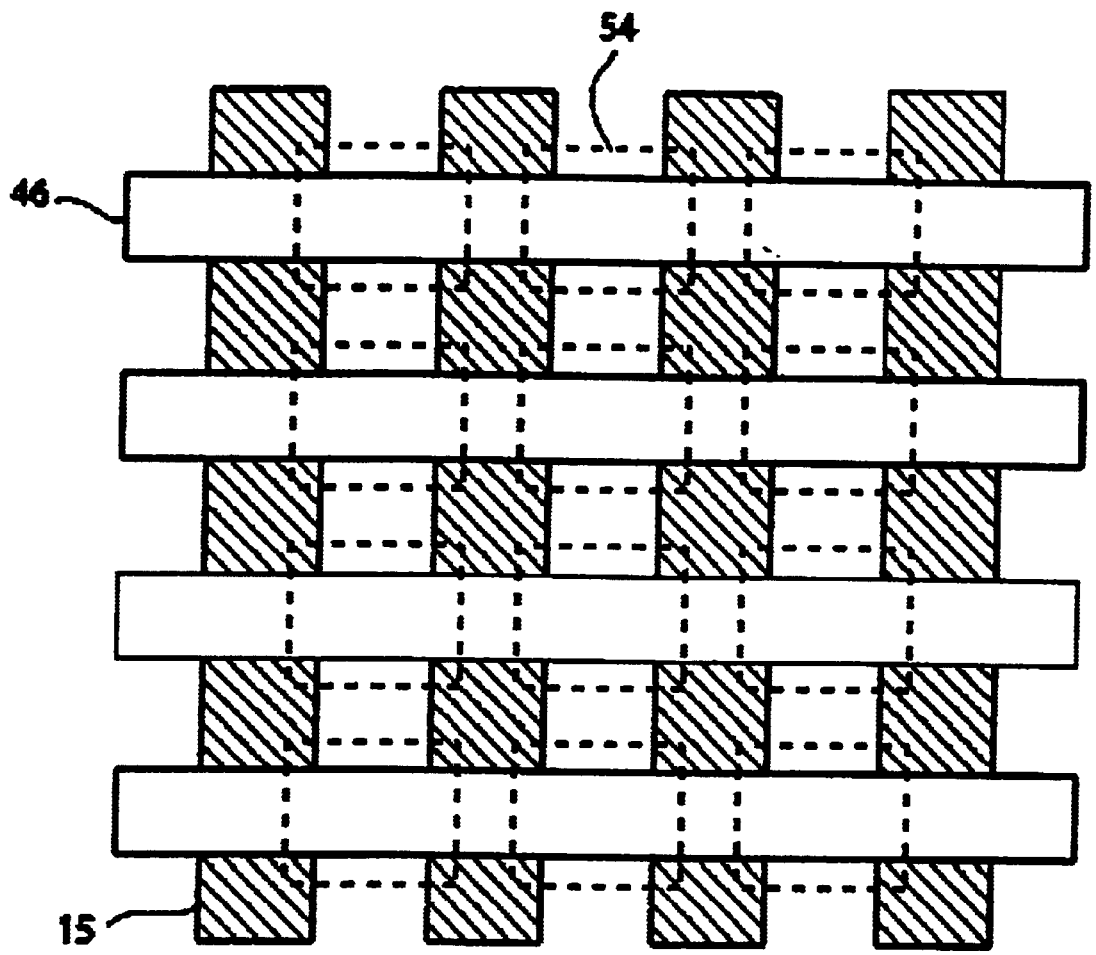
FIG. 12 is a plan view of an NROM device in an intermediate processing step showing ON block structures in phantom.

A plan view of the NROM device of FIG. 11 is illustrated in FIG. 12. The plurality of ON block structures 54 (shown in phantom) are preferably disposed directly beneath the plurality of word line structures 46. As elucidated by the drawing, the plurality of ON block structures 54 are wider than members of the plurality of word line structures 46, and overlap adjoining members of the plurality of bit lines 15.

In accordance with the present invention, since the ON block structures 54 are wider than the word line structures 46, and overlap portions of the adjoining buried drain regions (plurality of bit lines 15), the leakage problem associated with current NROM technologies may be attenuated or avoided. In view of the foregoing, it will be understood by those skilled in the art that the methods of the present invention can facilitate formation of operational NROM memory devices in integrated circuits. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method for forming at least one nonvolatile memory device, comprising the following steps:
    (a) forming a trapping layer on a prepared substrate;
    (b) forming a patterned photoresist layer on the trapping layer;
    (c) using the patterned photoresist layer as an implanting mask to perform an implantation to form at least one bit line;
    (d) forming a first material layer on surfaces of the photoresist layer;
    (e) using the first material layer as an etching mask to pattern the trapping layer into at least one trapping layer strip;
    (f) removing the first material and the patterned photoresist layer;
    (g) forming an oxide beside the at least one trapping layer strip and above the at least one bit line;
    (h) forming at least one word line on the at least one trapping layer strip;
    (i) forming a second material layer on surfaces of the at least one word line;
    (j) using the second material layer as an etching mask to pattern the at least one trapping layer strip into a plurality of trapping layer block structures; and
    (k) removing the second material layer.

2. The method of claim 1, wherein the first material layer comprises a first polymer and the second material layer comprises a second polymer.

3. The method of claim 2, wherein the trapping layer comprises in sequence, a first oxide layer, a nitride layer, and a second oxide layer, the first oxide layer, nitride layer, and second oxide layer forming an oxide-nitride-oxide (ONO) stack.

4. The method of claim 3, wherein the step of patterning the trapping layer comprises patterning the oxide-nitride layer of the ONO stack only so that the first oxide layer remains substantially unpatterned.

5. The method of claim 2, further comprising a step of forming a BARC layer before the photoresist layer is formed.

6. The method of claim 2, wherein:
    the at least one bit line comprises a plurality of bit lines;
    the at least one trapping layer strip comprises a plurality of trapping layer strips; and
    the at least one word line comprises a plurality of word lines.

7. The method of claim 6, wherein:
    the trapping layer comprises an oxide-nitride-oxide (ONO) film; and
    the step of patterning the trapping layer comprises patterning the oxide-nitride layer of the ONO stack only so that the first oxide layer remains substantially unpatterned.

8. A method for forming a nonvolatile memory on a semiconductor substrate, the method comprising the steps of:
    (a) providing a prepared semiconductor substrate;
    (b) forming a trapping layer on the semiconductor substrate;
    (c) applying and patterning a photoresist over the trapping layer to form a plurality of photoresist strips;
    (d) selectively implanting the semiconductor substrate to form a plurality of bit lines;
    (e) forming a first material layer on surfaces of the patterned photoresist;
    (f) etching back portions of the trapping layer to form a plurality of trapping layer strips;
    (g) removing the first material layer and the patterned photoresist;
    (h) forming an oxide over the plurality of bit lines;
    (i) forming a plurality of word lines;
    (j) forming a second material layer on surfaces of the word lines;
    (k) etching portions of the plurality of trapping layer strips to form a plurality of trapping layer block structures; and
    (l) removing the second material layer.

9. The method of claim 8, wherein the first material layer comprises a first polymer and the second material layer comprises a second polymer.

10. The method of claim 9, wherein the step of forming an oxide comprises a step of growing an oxide between the trapping layer strips until a height of the oxide is about equal to a height of the trapping layer strips.

11. The method of claim 9, wherein the trapping layer comprises in sequence, a first oxide layer, a nitride layer, and a second oxide layer, the first oxide layer, nitride layer, and second oxide layer forming an oxide-nitride-oxide (ONO) stack.

12. The method of claim 11, wherein the second oxide layer is grown over the nitride layer, and wherein the second oxide layer consumes a portion of the nitride layer during the growth.

13. The method of claim 11, wherein the etch performed in step (f) removes portions of the second oxide layer and the nitride layer only.

14. The method of claim 11, wherein the etch performed in step (f) removes portions of the second oxide layer and portions of the nitride layer, and further removes smaller portions of the first oxide layer, the portions being substantially greater than the smaller portions.

15. The method of claim 9, wherein the first polymer and the second polymer are formed using a dielectric resolution enhancement coating technique.

16. The method of claim 15, wherein the dielectric resolution enhancement coating technique is performed in an etcher.

17. The method of claim 9, wherein the first polymer layer is used as an etch block during the etch of step (f).

18. The method of claim 9, wherein the second polymer layer is used as an etch block during the etch of step (k).

19. The method of claim 9, wherein the plurality of word lines are centrally disposed above corresponding members of the plurality of trapping layer block structures.

20. The method of claim 9, wherein each trapping layer block structure overlaps portions of adjoining bit lines of the plurality of bit lines.

21. The method of claim 9, wherein each trapping layer block structure has a greater width than a corresponding word line.

* * * * *

UNITED STATES PATENT AND TRADEMARK OFFICE
CERTIFICATE OF CORRECTION

PATENT NO. : 6,713,332 B2
DATED : March 30, 2004
INVENTOR(S) : Chia-Chi Cung

It is certified that error appears in the above-identified patent and that said Letters Patent is hereby corrected as shown below:

<u>Column 7,</u>
Lines 20-21, "surfaces of the photoresist layer" should read -- surfaces of the patterned photoresist layer --

Signed and Sealed this

Twelfth Day of October, 2004

JON W. DUDAS
*Director of the United States Patent and Trademark Office*